United States Patent [19]

Stacey

[11] Patent Number: 4,479,160

[45] Date of Patent: Oct. 23, 1984

[54] BAND-PASS SEQUENCE FILTERS FOR SYMMETRICAL COMPONENTS OF MULTIPHASE AC POWER SYSTEMS

[75] Inventor: Eric J. Stacey, Penn Hills, Pa.

[73] Assignee: Westinghouse Electric Corp., Pittsburgh, Pa.

[21] Appl. No.: 490,697

[22] Filed: May 2, 1983

[51] Int. Cl.³ ............................................. H02H 3/26
[52] U.S. Cl. ........................................ 361/76; 361/85; 324/86; 307/177; 340/658
[58] Field of Search ................. 361/76, 85, 77, 113, 361/78; 324/86, 108; 307/127; 328/133, 138, 149; 340/658

[56] References Cited

U.S. PATENT DOCUMENTS

| | | | |
|---|---|---|---|
| 3,535,542 | 10/1970 | Gilsig . | |
| 3,714,588 | 1/1973 | Deboo et al. | 328/167 |
| 3,727,147 | 4/1973 | DeWitt | 330/84 |
| 3,978,416 | 8/1976 | Sutphin, Jr. | 328/167 |
| 3,978,420 | 8/1976 | Lane | 330/107 |
| 4,032,852 | 6/1977 | Hulls et al. | 328/167 |
| 4,053,820 | 10/1977 | Peterson et al. | 363/44 |
| 4,063,450 | 12/1977 | Lyons | 73/579 |
| 4,150,412 | 4/1979 | Hammarlund | 361/76 |
| 4,210,948 | 7/1980 | Waltz | 361/76 |
| 4,366,521 | 12/1982 | Jessee | 361/76 |

Primary Examiner—Patrick R. Salce
Attorney, Agent, or Firm—R. P. Lenart

[57] ABSTRACT

A three-phase symmetrical component active band-pass filter includes three 120° phase shift circuits which are connected in a closed loop fashion such that each phase shift circuit receives an input signal from one phase of an associated power system and a second signal from the output of one of the other phase shift circuits. A voltage tunable filter is formed by using multipliers to couple some fraction of the output of each phase shift circuit to a summing point at the input of another phase shift circuit. Phase comparators and an integrator can be added to achieve a self-tracking tuning arrangement.

8 Claims, 15 Drawing Figures

BAND-PASS SEQUENCE FILTERS FOR SYMMETRICAL COMPONENTS OF MULTIPHASE AC POWER SYSTEMS

BACKGROUND OF THE INVENTION

This invention relates to apparatus used in detecting and measuring the symmetrical components in multiphase AC electrical power systems and more particularly to sequence filters which generate an output signal which is proportional to a particular set of symmetrical components.

It is common to represent the sinusoidal currents and voltages of a multiphase AC electrical power system as a set of rotating vectors. Any three vectors, which may be unsymmetrical or unbalanced, can be resolved into a system of three equal vectors and two symmetrical three-vector systems, which are known as the positive and negative phase sequences. The detection of these phase sequences is useful in determining the degree of unbalance of the power system and can be used to indicate the occurrence of a fault in the system. General background information concerning the use of sequence filters in multiphase AC power systems is contained in U.S. Pat. No. 4,210,948, issued July 1, 1980 to Waltz and U.S. Pat. No. 4,366,521, issued Dec. 28, 1982 to Jessee. These patents are hereby incorporated by reference.

In certain alternating current power systems, such as those used on aircraft, variation in frequency may occur. The phase sequence filters used in conjunction with these systems must be substantially unaffected by variations in frequency. The filters of the present invention are selective for frequency and phase sequence, and can be combined with a three-phase self-tuning arrangement to achieve a fast tracking unique transfer characteristic. Using few components and yielding inherently balanced outputs, this filter is advantageous for many control and instrumentation applications.

SUMMARY OF THE INVENTION

A three-phase symmetrical component band-pass filter constructed in accordance with the present invention includes three operational stages, each of which has close-to-unity gain and provides a phase shift which is 120° at a preselected frequency. These stages are connected in a closed loop such that each stage receives an input from one phase of the power system which is being monitored and also receives a second input from the output of one of the other stages. The ouputs of each stage will have a maximum amplitude when the input has the proper phase sequence and is at a preselected resonant frequency. The phase gain relationship of the filter is frequency dependent and, at resonance, the outputs are 180° out of phase with the inputs.

DESCRIPTION OF THE PREFERRED EMBODIMENTS

Figure 1:
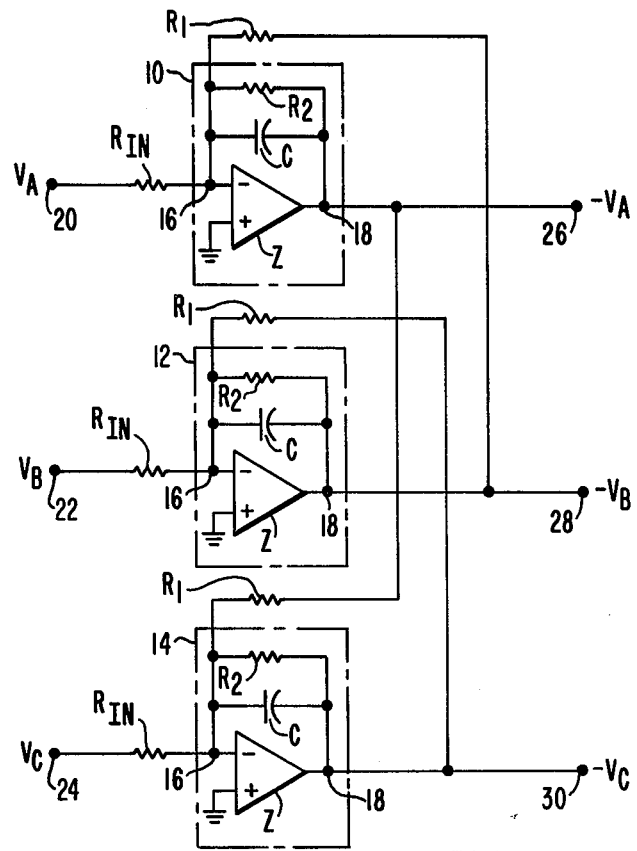
FIG. 1 is a schematic diagram of a three-phase positive sequence active band-pass filter constructed in accordance with one embodiment of the present invention.

Referring to the drawings, FIG. 1 is a schematic diagram of a three-phase positive sequence active band-pass filter constructed in accordance with one embodiment of the present invention. The filter comprises three identical stages, 10, 12 and 14, each having an input 16 and an output 18. The stage components, resistor $R_2$, capacitor C and amplifier Z are selected such that a signal fed to an input 16 through resistor $R_1$ is shifted by 120° at resonance at output 18. Input 16 of circuit stage 10 is connected through input resistance $R_{IN}$ to a terminal 20 which receives a voltage signal $V_A$ proportional to the voltage of phase A of the power system. Similarly, the inputs of circuit stages 12 and 14 are conected through identical input resistances $R_{IN}$ to terminals 22 and 24 which receive voltage signals $V_B$ and $V_C$ corresponding to voltages on phases B and C of the power system. The phase shifting stages of this circuit are connected in a loop such that each stage input is connected through a feedback resistor $R_1$ to the output of one of the other stages. In this embodiment, the input of stage 10 is connected to the output of stage 12, the input of stage 12 is connected to the output of stage 14, and the input of stage 14 is connected to the output of stage 10. With this arrangement, voltage signals appearing at terminals 26, 28 and 30, which are connected to the output terminals of circuit stages 10, 12 and 14, respectively, are substantially equivalent to the positive sequence components of voltage signals appearing at terminals 20, 22 and 24, respectively, having been shifted by 180°.

Figure 2:
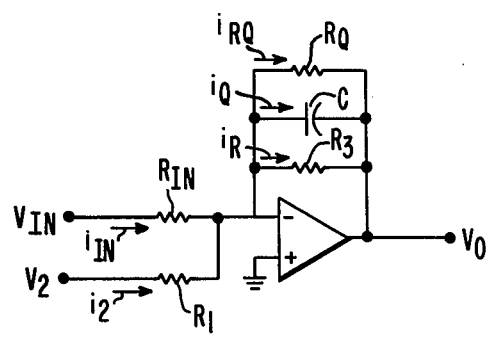
FIG. 2 is a schematic diagram of a phase shifting stage which is similar to the stages of the circuit of FIG. 1.

The operation of the filter of this invention can be explained by reference to a single one of the three phase shifting stages as shown in FIG. 2. In order to simplify the discussion, two parallel connected resistors $R_Q$ and $R_3$ are shown in place of the equivalent single resistor $R_2$ of the phase shifting circuit stages of FIG. 1 with the value of $R_3$ being twice the value of $R_2$. An infinite "Q" filter is formed when the gain of each stage is unity and the phase shift is exactly 120°. This condition is met if $R_{IN}$ and $R_Q$ are both equal to infinity, while $R_3$ is equal to $2R_1$ and the capacitor impedance $X_Z$ is equal to $2R_1/\sqrt{3}$. For this idealized case, a resonant frequency $f_0$ is then equal to $\sqrt{3}/(4\pi R_1 C)$. Now if $R_2$ and $R_{IN}$ are finite, the filter has a gain at resonance of:

$$G = \frac{V_O}{V_{IN}} = \frac{-R_Q}{R_{IN}} \tag{1}$$

and an effective Q factor of:

$$Q = \frac{R_Q}{X_C} = \frac{\sqrt{3}}{2} \cdot \frac{R_Q}{R_1} \quad (2)$$

therefore:

$$R_Q = Q \cdot \frac{2R_1}{\sqrt{3}} \quad (3)$$

Figure 3:
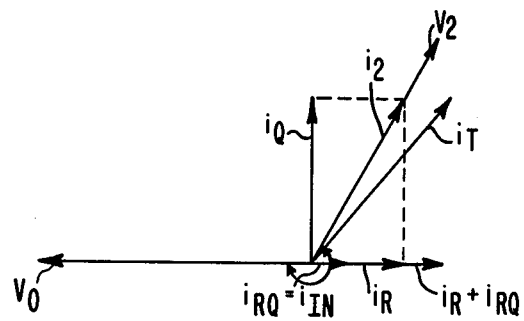
FIGS. 3, 4 and 5 are vector diagrams illustrating the operation of the circuit of FIG. 2.

At resonance, the input current $i_{IN}$ flowing in $R_{IN}$ will be equal to the current $i_{RQ}$ flowing in resistor $R_Q$ and the vector relationship is as shown in FIG. 3.

Figure 4:
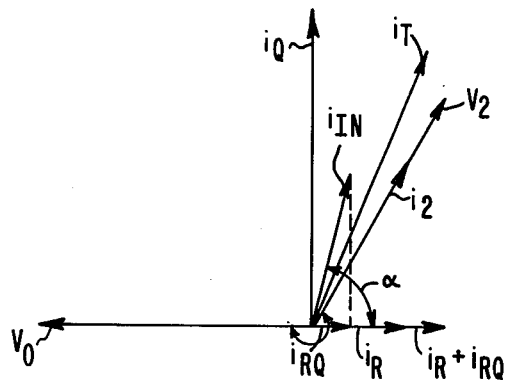
Figure 5:
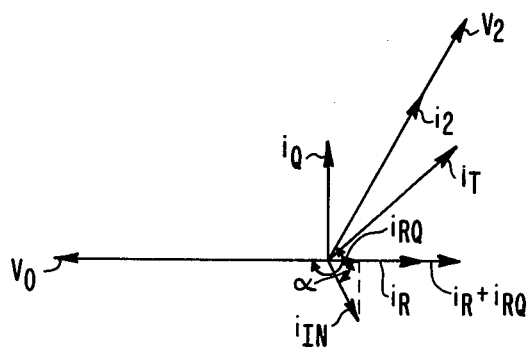

In the case where the input frequency is above resonance, as shown in the vector diagram of FIG. 4, a larger magnitude input current leading $i_{RQ}$ by the angle $\alpha$ is required to maintain output $V_O$ constant. Similarly, if the input frequency is below resonance, as illustrated in FIG. 5, a large value of $i_{IN}$ which now lags $i_{RQ}$ is required. In general, for constant output the value of input current $i_{IN}$ is lowest at resonance when it is equal to the current $i_{RQ}$.

Adopting the subscript O to denote a value at resonance, as in $f_O$, $\omega_O$, $i_{Q_O}$, etc., the following vector equation can be written for input current:

$$\overline{i_{IN}} = \overline{i_Q} - \overline{i_{QO}} + \overline{i_{RQ}} \quad (4)$$

where $$i_Q = -V_O \cdot j\omega c \quad (5)$$

$$i_{QO} = -V_O \cdot j\omega_O c \quad (6)$$

$$i_{IN} = -V_O\left(\frac{1}{R_Q} + jc(\omega - \omega_o)\right) \quad (7)$$

The stage gain is:

$$G = \frac{V_O}{V_{IN}} = \frac{i_R \cdot 2R_1}{i_{IN} \cdot R_Q} \quad (8)$$

therefore:

$$G = \frac{-V_O}{2R_1} \cdot \frac{1}{-V_O\left(\frac{1}{R_Q} + jc(\omega - \omega C)\right)} \cdot \frac{2R_1}{R_Q} \quad (9)$$

$$|G| = \frac{1}{R_O\sqrt{\frac{1}{R_Q^2} + (2\pi C(f - fc))^2}} \quad (10)$$

and the output lags by $\theta°$, wherein:

$$\theta° = 180 - \tan^{-1}(2\pi R_Q C(f - f_O)) \quad (11)$$

Figure 6:
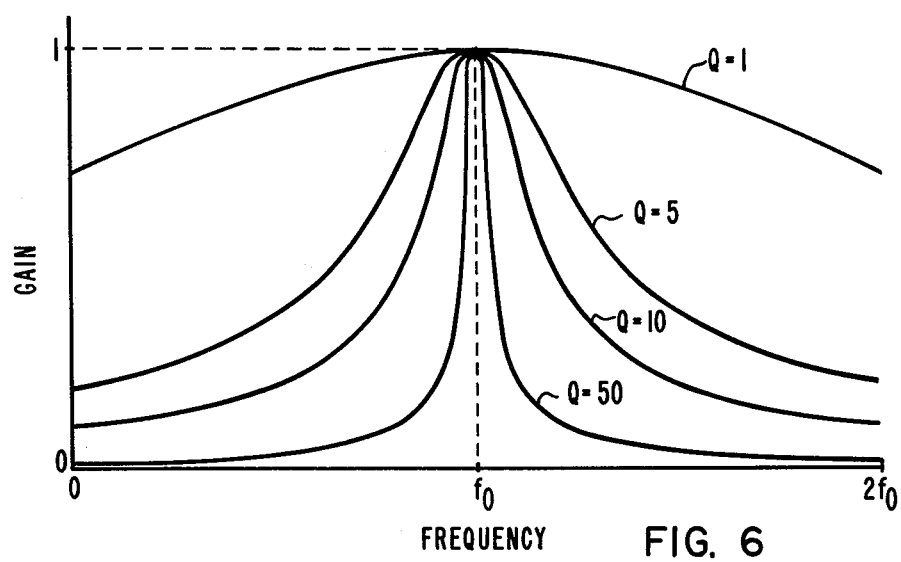
FIGS. 6 and 7 show the normalized positive sequence characteristic of the circuit of FIG. 1.
Figure 7:
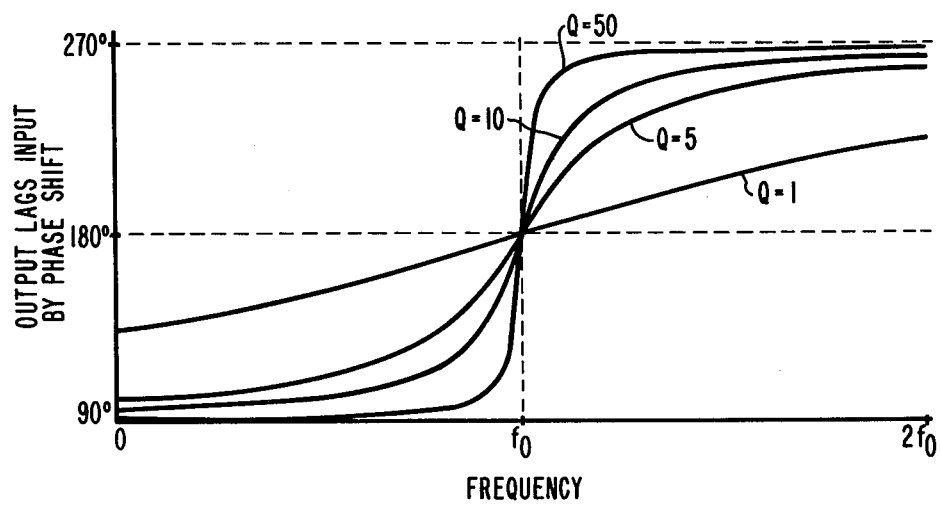
Figure 8:
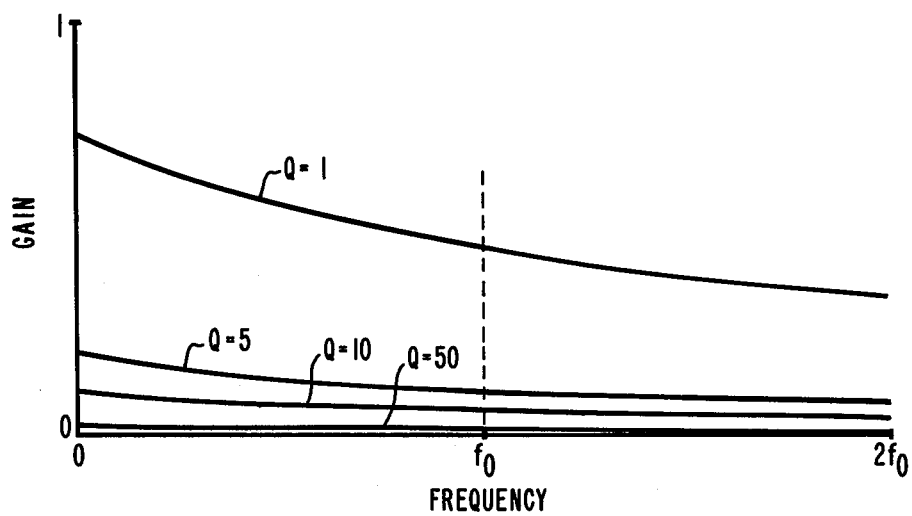
FIGS. 8 and 9 show the normalized negative sequence characteristic of the circuit of FIG. 1.
Figure 9:
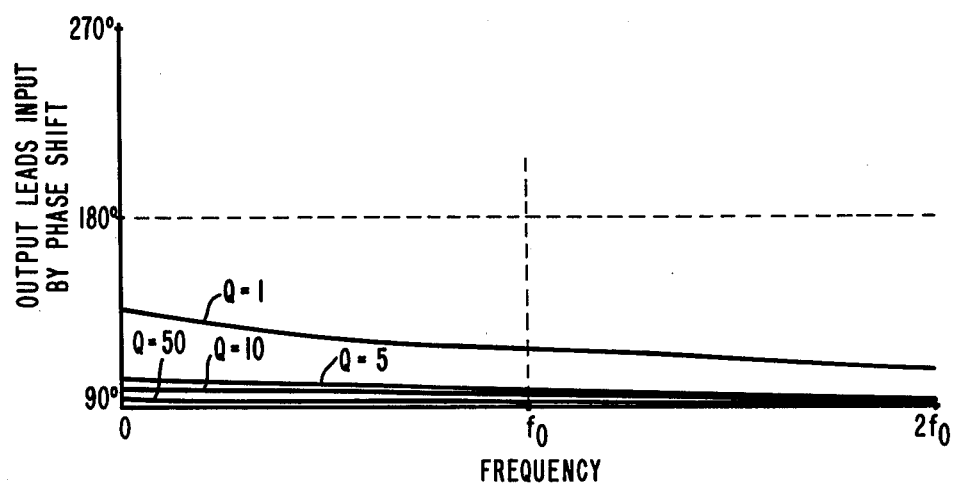
Figure 10:
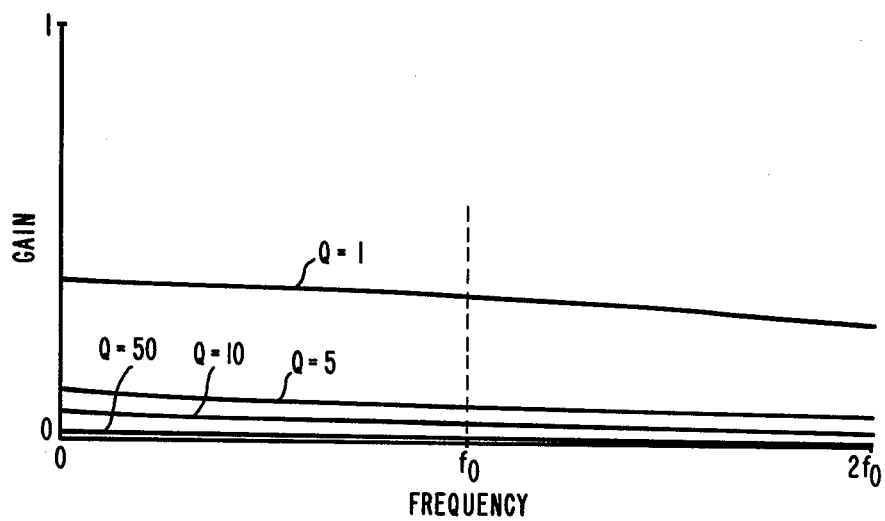
FIGS. 10 and 11 show the normalized zero sequence characteristic of the circuit of FIG. 1.
Figure 11:
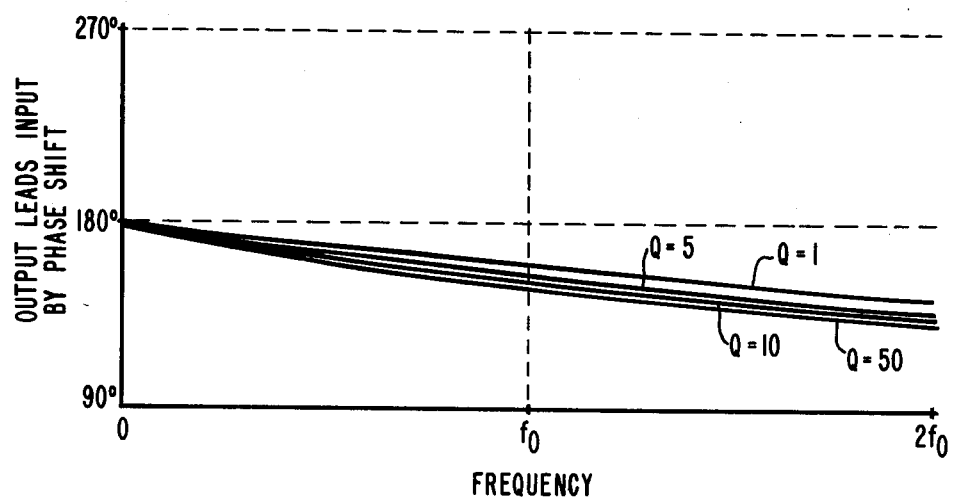
Figure 12:
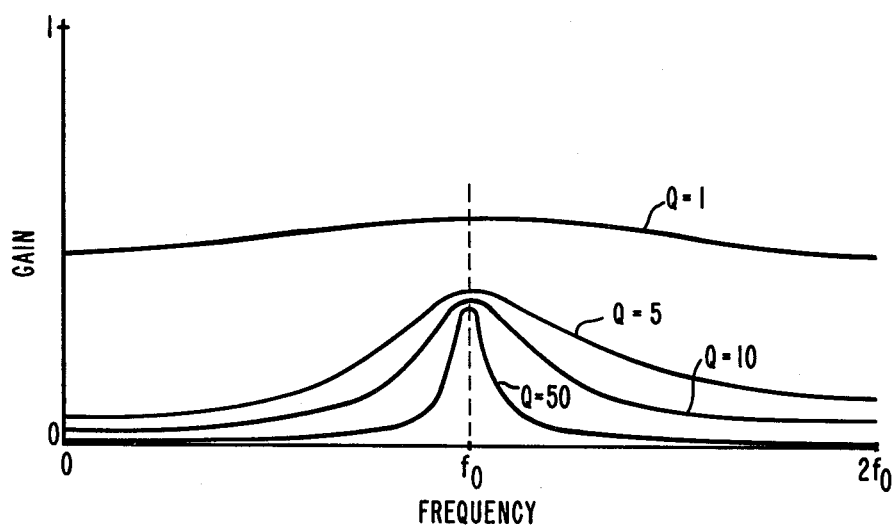
FIGS. 12 and 13 show the output characteristic for one output of the circuit of FIG. 1 with a single input.
Figure 13:
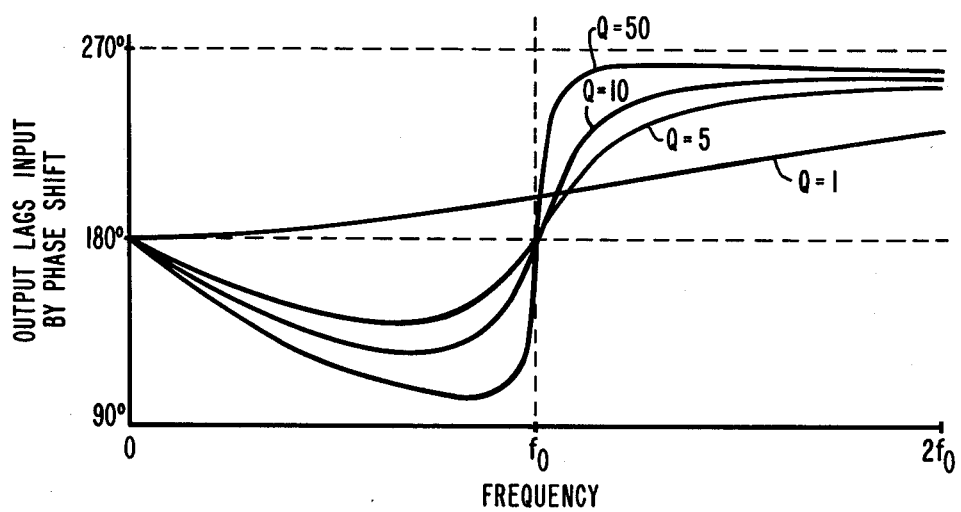

Normalized characteristics for positive sequence components in the circuit of FIG. 1, with Q factors of 1, 5, 10 and 50 are shown in FIGS. 6 and 7. Similar sets of characteristics, for negative sequence components, are shown in FIGS. 8 and 9. FIGS. 10 and 11 show the normalized characteristic for the zero sequence components, and FIGS. 12 and 13 show the normalized characteristic for the output on terminal 26 of FIG. 1 with a single input appearing on terminal 20.

Figure 14:
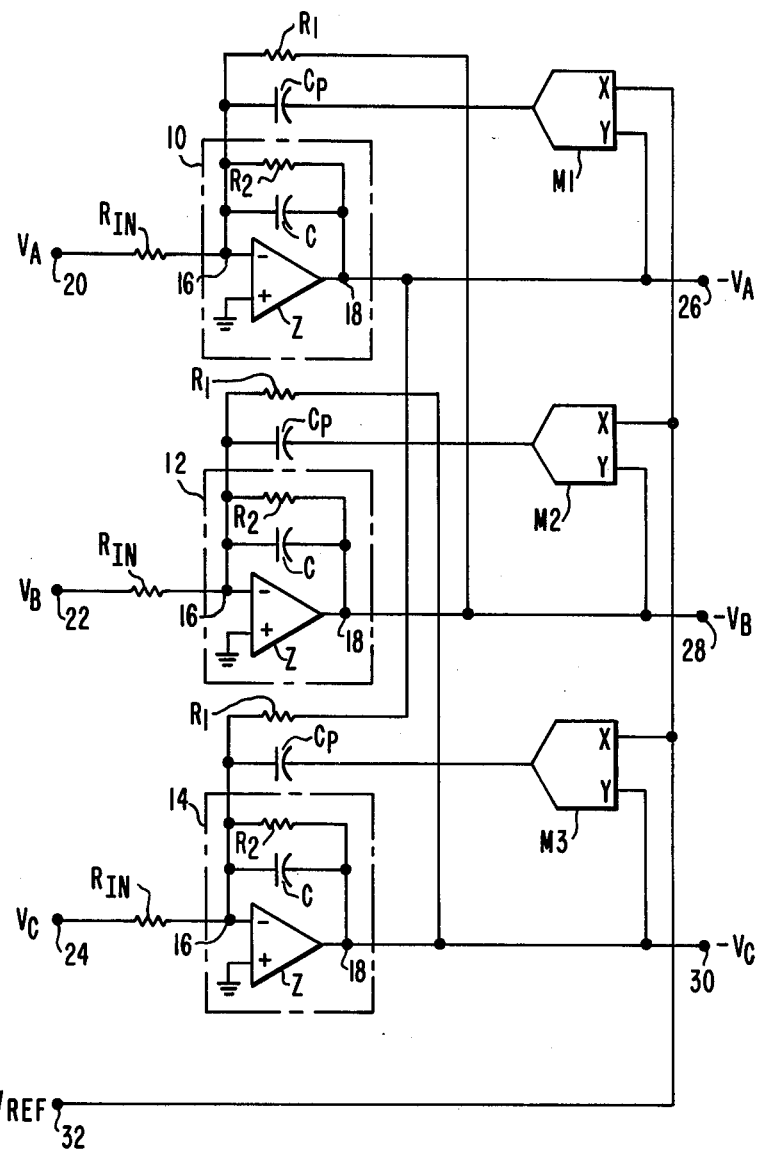
FIG. 14 is a schematic diagram of an alternative embodiment of the present invention in the form of a voltage tunable constant Q fliter.

A voltage tunable, constant Q version of the filter having the characteristics of FIGS. 6 and 7, may be easily formed by the addition of three analog multipliers M1, M2 and M3, as shown in FIG. 14. Each multiplier has two inputs, X and Y, and an output which is coupled to an input 16 of one of the phase shifting circuits through a tuning capacitor $C_P$. The X inputs of these multipliers are connected to terminal 32 which receives a d.c. reference voltage $V_{ref}$. The Y input of each multiplier is connected to one of the phase shift circuit outputs. In this arrangement, each multiplier is used to couple some multiple, or fraction, of the output of an associated operational amplifier in a phase shifting circuit to a summing point connected to phase shifting circuit input 16. If the output of the multipliers can swing over $\pm 1$ times their inputs, the effective range of tuning capacitance is $C_E = C \pm C_P$.

The relative values of C and $C_P$ may be chosen to give any desired range of tuning. For a limited range of frequency, where $C_P$ is much smaller than C, the inaccuracies and non-linearities of the multiplier have an insignificant effect. For an infinite tuning range, $C_P$ can be made equal to the value of C. In this case, when the output of the multipliers approach $-1$ times the input, inaccuracies in component values become significant. While the capacitor C may be omitted if the multiplier is restricted to two-quandrant operation, errors that result from the multiplier non-linearities may be halved if both capacitors are employed for a given tuning range. For greater accuracy, the tuning range should not exceed the requirements of the particular application.

Figure 15:
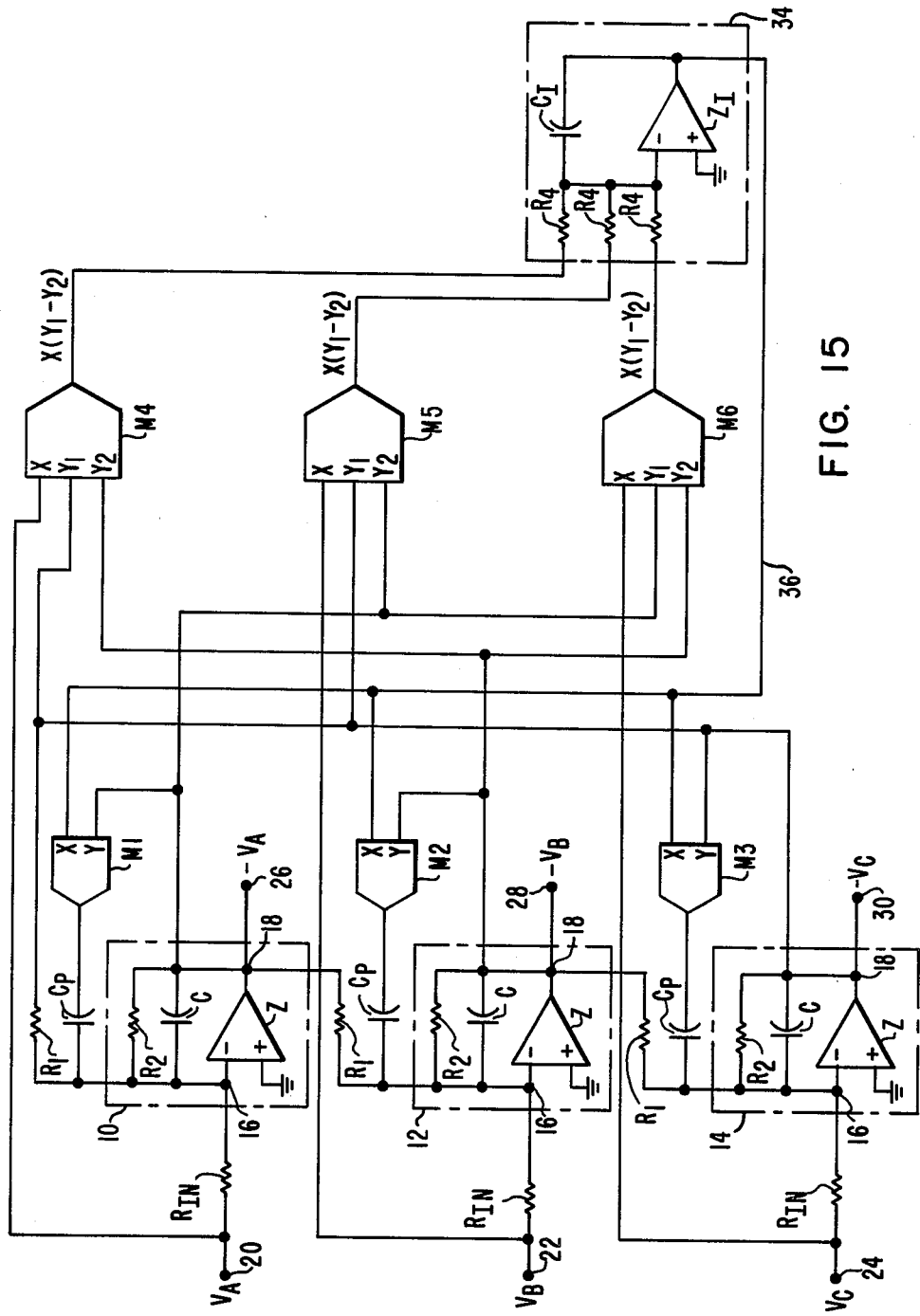
FIG. 15 is a schematic diagram of another alternative embodiment of this invention in the form of a self-tuning filter.

Once voltage tuning has been incorporated, phase comparators M4, M5 and M6 and an error integrating circuit 34 can be added for self-tuning as shown in FIG. 15. The phase comparators M4, M5 and M6 are actually analog multipliers which include an input terminal X for receiving the input phase signal and input terminals $Y_1$ and $Y_2$ for receiving the complementing phase-to-phase outputs. Therefore, these multipliers compare each input with the complementing phase-to-phase outputs, which at resonance are in quadrature with their associated inputs, to produce an output signal equal to $X(Y_1-Y_2)$. The outputs of these multipliers have a predominant double-frequency component and a mean value of zero at resonance. The mean value will depart from zero, becoming positive or negative, when the input frequency is respectively above or below resonance. As a result, if the input is above resonance, the outputs of the phase comparators are positive and the output of the following operational integrator 34 will become more negative. Voltage bus 36 receives the integrator output and feeds it as a control voltage to the X inputs of multipliers M1, M2 and M3. The effective output of the tuning multipliers is, therefore, changed resulting in a reduction in effective tuning capacitance, until eventually the filter becomes retuned to the higher frequency.

Although the circuit of FIG. 15 uses three phase comparators M4, M5 and M6, it should be understood that self-tuning will occur even if any one or two of these phase comparators are not used.

By way of further example, Table I identifies specific components that may be used in the circuit of FIG. 15 for a sequence filter having a Q of 10 and a tuning range of 40 to 80 Hz.

TABLE I

| | |
|---|---|
| C | 0.25 μF |
| $C_P$ | 0.1 μF |

TABLE I-continued

| | |
|---|---|
| $C_I$ | 2.0 μF |
| $R_{IN}$ | 115.5K |
| $R_1$ | 10K |
| $R_2$ | 17.05K |
| $R_4$ | 20K |
| $Z, Z_I$ | 741 |
| M1, M2, M3, M4, M5, M6 | AD534 |

The AD534 analog multipliers listed in Table I include differential inputs for both X and Y quantities. Therefore their output is:

$$V_O = (X_1 - X_2)(Y_1 - Y_2).$$

If only X is designated as in FIG. 15, then the $X_2$ input is zero.

While this type of self-tracking arrangement is well known in conjunction with single-phase active filters, it is particularly advantageous when applied to the three-phase filter of this invention. Here, the predominant double-frequency components of the three-phase error detector multipliers cancel when they are summed together through the summing network resistors $R_4$. A relatively fast slewing integrator can now be used to filter any extraneous frequency components and much faster tracking of a changing input frequency is possible. The capture range may also be extended. Since the three-phase filter of this invention has inherently balanced outputs, a common self-tracking tuning arrangement can be employed.

The three-phase band-pass filter of this invention provides several advantages over the use of three single-phase filters. The three-phase band-pass filter inherently selects the positive phase sequence components only at its resonance frequency. Three single-phase filters could not differentiate between positive, negative and zero sequence components. In addition, an inherently balanced three-phase output is always obtained even with a common three-phase tuning arrangement that would not be practical with three single-phase filters. Single-phase filters would require individual phase comparators and self-tuning feedback connections, if accurate phase relationships were required. Furthermore, three-phase tracking can be accomplished at a much faster rate, since the summed outputs of the three-phase comparators have three times the mean value of a single-phase comparator and no filtering is required for second harmonic components since they cancel.

The primary application areas of this invention include power electronics control, signal processing and metering. This filter may be used to improve the stability and reduced harmonic sensitivity of digital phase-locked loop systems used in control systems such as that employed in motor control, converters, cyclo converters and static VAR generators. The filter may also be used to derive clean timing waves to be used in cosine crossing and other converter/cycloconverter control systems. With the self-tracking version, very precise tuning over a limited or wide range of frequency can be achieved without changing the quality "Q" factor of the filter. This feature combined with the inherent fast tracking ability make this filter ideal for incorporation into the control of variable speed constant frequency power generating systems. Variable speed drives employing DC link inverters, or static power frequency changers, may also make use of this filter for control and metering purposes.

Although this invention has been described in terms of what are at present believed to be its preferred embodiments, it will be apparent to those skilled in the art that various changes and modifications may be made without departing from the scope of the invention. For example, the filter of FIG. 1 may be used to sense negative phase sequence components by simply rearranging the phase rotation applied to its inputs. In addition, a notch filter that will reject the fundamental positive phase sequence may be easily derived. By employing a differential amplifier to derive the difference between the input and the output of each stage, the required function is achieved. For proper operation, it is important that the filter be precisely tuned, and for this purpose, the automatic tuning function will probably prove necessary. It is, therefore, intended that the appended claims cover all such changes which may occur within the scope of the invention.

What is claimed is:

1. A symmetrical component sequence filter for providing an output signal representative of a predetermined sequence quantity of a three-phase electrical power system, comprising:
    a first phase shifting means having an input and an output, for shifting a first electrical signal of a preselected frequency by 120 electrical degrees;
    a second phase shifting means having an input and an output, for shifting a second electrical signal of said preselected frequency by 120 electrical degrees;
    a third phase shifting means having an input and an output, for shifting a third electrical signal of said predetermined frequency by 120 electrical degrees;
    means for providing fourth, fifth and sixth electrical signals, responsive to the three phases of the electrical power system, to said inputs of said first, second and third phase shifting means respectively;
    means for coupling said output of said second phase shifting means to said input of said first phase shifting means;
    means for coupling said output of said third phase shifting means to said input of said second phase shifting means; and
    means for coupling said output of said first phase shifting means to said input of said third phase shifting means.

2. A symmetrical component sequence filter as recited in claim 1, wherein each of said phase shifting means has a gain which is less than one.

3. A symmetrical component sequence filter as recited in claim 1, wrehein each of said phase shifting means comprises:
    an operational amplifier having an inverting input and an output; and
    a feedback circuit connected between said operational amplifier inverting input and output, said feedback circuit including the parallel connection of a resistor and a capacitor.

4. A symmetrical component sequence filter as recited in claim 1, wherein said means for providing fourth, fifth and sixth electrical signals comprises:
    three resistors respectively connected between the three phases of the electrical power system and said inputs of said first second and third phase shifting means.

5. A symmetrical component sequence filter as recited in claim 1, wherein:

said means for coupling said output of said second phase shifting means to said input of said first phase shifting means comprises a first resistor;

said means for coupling said output of said third phase shifting means to said input of said second phase shifting means comprises a second resistor; and said means for coupling said output of said first phase shifting means to said input of said third phase shifting means comprises a third resistor.

6. A symmetrical component sequence filter as recited in claim 1, further comprising:

a terminal for receiving a reference voltage;

a first multiplier having a first input connected to said reference voltage terminal, a second input connected to said output of said first phase shifting means, and an output connected to one side of a first capacitor, wherein the other side of said first capacitor is connected to said input of said first phase shifting means;

a second multiplier having a first input connected to said reference voltage terminal, a second input connected to said output of said second phase shifting means, and an output connected to one side of a second capacitor, wherein the other side of said second capacitor is connected to said input of said second phase shifting means; and a third multiplier having a first input connected to said reference voltage terminal, a second input connected to said output of said third phase shifting means, and an output connected to one side of a third capacitor, wherein the other side of said third capacitor is connected to said input of said third phase shifting means.

7. A symmetrical component sequence filter as recited in claim 1, further comprising:

a first multiplier having a first input connected to a voltage bus, a second input connected to said output of said first phase shifting means and an output connected to one side of a first capacitor, wherein the other side of said first capacitor is connected to said input of said first phase shifting means;

a second multiplier having a first input connected to said voltage bus, a second input connected to said output of said second phase shifting means, and an output connected to one side of a second capacitor, wherein the other side of said second capacitor is connected to said input of said second phase shifting means;

a third multiplier having a first input connected to said voltage bus, a second input connected to said output of said second phase shifting means, and an output connected to one side of a third capacitor, wherein the other side of said third capacitor is connected to said input of said third phase shifting means;

a fourth multiplier having a first input coupled to a first phase of the electrical power system, a second input connected to said output of said third phase shifting means, a third input connected to said output of said second phase shifting means, and an output terminal;

a fifth multiplier having a first input coupled to a second phase of the electrical power system, a second input connected to said output of said first phase shifting means, a third input connected to said output of said third phase shifting means, and an output terminal;

a sixth multiplier having a first input coupled to a third phase of the electrical power system, a second input connected to said output of said second phase shifting means, a third input connected to said output of said first phase shifting means, and an output terminal; and means for integrating the sum of all voltage signals which appear on said outputs of said fourth, fifth and sixth multipliers to develop a control voltage on said voltage bus.

8. A symmetrical component sequence filter as recited in claim 1, further comprising:

a first multiplier having a first input connected to a voltage bus, a second input connected to said output of said first phase shifting means and an output connected to one side of a first capacitor, wherein the other side of said first capacitor is connected to said input of said first phase shifting means;

a second multiplier having a first input connected to said voltage bus, a second input connected to said output of said second phase shifting means, and an output connected to one side of a second capacitor, wherein the other side of said second capacitor is connected to said input of said second phase shifting means;

a third multiplier having a first input connected to said voltage bus, a second bus, a second input connected to said output of said second phase shifting means, and an output connected to one side of a third capacitor, wherein the other side of said third capacitor is connected to said input of said third phase shifting means;

a fourth multiplier having a first input coupled to a first phase of the electrical power system, a second input connected to said output of said third phase shifting means, a third input connected to said output of said second phase shifting means, and an output terminal; and means for integrating a voltage signal appearing at the output terminal of said fourth multiplier to develop a control voltage on said voltage bus.

* * * * *